United States Patent
Nopper et al.

(10) Patent No.: US 6,951,816 B2
(45) Date of Patent: Oct. 4, 2005

(54) METHOD OF FORMING A METAL LAYER OVER PATTERNED DIELECTRIC BY ELECTROLESS DEPOSITION USING A CATALYST

(75) Inventors: Markus Nopper, Dresden (DE); Axel Preusse, Radebeul (DE)

(73) Assignee: Advanced Micro Devices, Inc., Austin, TX (US)

( * ) Notice: Subject to any disclaimer, the term of this patent is extended or adjusted under 35 U.S.C. 154(b) by 66 days.

(21) Appl. No.: 10/602,192

(22) Filed: Jun. 24, 2003

(65) Prior Publication Data

US 2004/0145062 A1 Jul. 29, 2004

(30) Foreign Application Priority Data

Jan. 23, 2003 (DE) .......................... 103 02 644

(51) Int. Cl.[7] .............................. H01L 21/44
(52) U.S. Cl. ................... 438/678; 438/677; 438/687
(58) Field of Search ................ 438/678, 584, 438/677, 687

(56) References Cited

U.S. PATENT DOCUMENTS

| 5,969,422 A | 10/1999 | Ting et al. ................ 257/762 |
|---|---|---|
| 6,403,481 B1 * | 6/2002 | Matsuda et al. ............ 438/687 |
| 6,461,675 B2 | 10/2002 | Paranjpe et al. ............ 427/250 |
| 6,479,902 B1 | 11/2002 | Lopatin et al. ............. 257/774 |
| 2002/0050459 A1 | 5/2002 | Matsuda et al. ............ 205/118 |
| 2003/0140988 A1 * | 7/2003 | Gandikota et al. .......... 148/527 |
| 2004/0041194 A1 * | 3/2004 | Marsh ........................ 257/306 |

FOREIGN PATENT DOCUMENTS

| EP | 1 201 787 A2 | 5/2002 | ........... C23C/18/28 |
|---|---|---|---|
| JP | 2002356733 A | 12/2002 | ........... C22C/27/04 |
| WO | WO 02/45155 A2 | 6/2002 | ......... H01L/21/768 |

OTHER PUBLICATIONS

Shacham–Diamand et al., "Electroless copper deposition for ULSI," *Thin Solid Films*, 262:93–103, 1995.

Lin et al., "Interfacial mechanism studies of electroless plated CU films on a–Ta:N layers catalyzed by PIII," *J. Vac. Sci. Technol.*, 20:733–40, 2002.

* cited by examiner

*Primary Examiner*—Caridad Everhart
(74) *Attorney, Agent, or Firm*—Williams, Morgan & Amerson, P.C.

(57) ABSTRACT

A metal layer is formed by means of an electroless plating process, wherein a surface region of an underlying material is catalytically activated in that a catalyst is deposited or incorporated by CVD, PVD or ALD during and/or after the deposition of the underlying material. In this way, superior metal seed layers may be formed even in high aspect ratio vias of metallization structures.

28 Claims, 2 Drawing Sheets

METHOD OF FORMING A METAL LAYER OVER PATTERNED DIELECTRIC BY ELECTROLESS DEPOSITION USING A CATALYST

BACKGROUND OF THE INVENTION

1. Field of the Invention

The present invention generally relates to the field of fabrication of integrated circuits, and, more particularly, to the formation of metal layers over a patterned dielectric, such as trenches and visa, by a wet chemical deposition process, such as electroless plating.

2. Description of the Related Art

In an integrated circuit, a huge number of circuit elements, such as transistors, capacitors, resistors, and the like, are formed in or on an appropriate substrate, usually in a substantially planar configuration. Due to the large number of circuit elements and the required complex layout of the integrated circuits, generally the electrical connection of the individual circuit elements may not be established within the same level on which the circuit elements are manufactured, but requires one or more additional "wiring" layers, also referred to as metallization layers. These metallization layers generally include metal lines, providing for the inner-level electrical connection, and also include a plurality of inter-level connections, also referred to as visa, wherein the metal lines and visa may also be commonly referred to as interconnects.

Due to the continuous shrinkage of the feature sizes of circuit elements in modern integrated circuits, the number of circuit elements for a given chip area, that is the package density, also increases, thereby requiring an even larger increase in the number of electrical interconnections to provide for the desired circuit functionality. Therefore, the number of stacked metallization layers may increase as the number of circuit elements per chip area becomes larger. Since the fabrication of a plurality of metallization layers entails extremely challenging issues to be solved, such as mechanical, thermal and electrical reliability of up to twelve stacked metallization layers that are required, for example, for sophisticated aluminum-based microprocessors, semiconductor manufacturers are increasingly replacing the well-known metallization metal aluminum by a metal that allows higher current densities and hence allows a reduction in the dimensions of the interconnections. For example, copper is a metal generally considered to be a viable candidate for replacing aluminum due to its superior characteristics in view of higher resistance against electromigration and significantly lower electrical resistivity when compared with aluminum. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD) and physical vapor deposition (PVD), and also may not be effectively patterned by the usually employed anisotropic etch procedures due to copper's characteristics to form non-volatile reaction products. In manufacturing metallization layers including copper, the so-called damascene technique is therefore preferably used, wherein a dielectric layer is first applied and then patterned to define trenches and visa, which are subsequently filled with copper. A further major drawback of copper is its propensity to readily diffuse in silicon dioxide and other dielectric materials.

It is therefore necessary to employ a so-called barrier material in combination with a copper-based metallization to substantially avoid any out-diffusion of copper into the surrounding dielectric material, as copper may then readily migrate to sensitive semiconductor areas, thereby significantly changing the characteristics thereof. Since the dimensions of the trenches and visa currently approach a width or a diameter of approximately 0.1 $\mu$m and even less with an aspect ratio of the visa of about 5 or more, the deposition of a barrier layer reliably on all surfaces of the visa and trenches and subsequent filling thereof with copper substantially without voids is one of the most challenging issues in the fabrication of modem integrated circuits.

Currently, the formation of a copper-based metallization layer is performed by patterning an appropriate dielectric layer and depositing the barrier layer, for example comprised of tantalum and/or tantalum nitride, by advanced PVD techniques, such as sputter deposition. For the deposition of a barrier layer of 10 to 50 nm in visa having an aspect ratio of 5 or even more, enhanced sputter tools are usually employed. Such tools offer the possibility to ionize a desired fraction of the target atoms after sputtering them off the target, thereby enabling to a certain degree the control of the bottom coverage and the sidewall coverage in the visa. Thereafter, the copper is filled in the visa and trenches, wherein electroplating has proven to be a viable process technique, since it is capable of filling the visa and trenches with a high deposition rate, compared to CVD and PVD rates, in a so-called bottom-up regime, in which the openings are filled starting at the bottom in a substantially void-free manner. Generally, in electroplating a metal, an external electric field has to be applied between the surface to be plated and the plating solution. Since a substrate for semi-conductor production may be contacted at restricted areas, usually at the perimeter of the substrate, a conductive layer covering the substrate and the surfaces that are to receive a metal has to be provided. Although the barrier layer previously deposited over the patterned dielectric may act as a current distribution layer, it turns out, however, that in view of crystallinity, uniformity and adhesion characteristics, presently, a so-called copper seed layer is required in the subsequent electroplating process to obtain copper trenches and visa having the required electrical and mechanical properties. The copper seed layer is typically applied by sputter deposition using substantially the same process tools as are employed for the deposition of the barrier layer.

For dimensions of 0.1 $\mu$m and less of visa in future device generations, the sputter deposition of extremely thin metal layers having a high degree of conformity as required for the barrier layer and the seed layer may become a limiting factor, since the coverage characteristics of the above-described advanced sputter tools may not be further enhanced without significant modifications of these tools, which seems to be not a straightforward development. Especially the deposition of the seed layer may not be performed in a straightforward manner by PVD as here the uniformity of the seed layer—contrary to the barrier layer "only" requiring a sufficient and complete coverage of the inner surfaces of the openings—determines to a certain degree the uniformity of the following electroplating process. Moreover, PVD techniques producing extremely thin layers appropriate for barrier layers may result, when applied to the formation of seed layers, in an increased electric resistance, thereby reducing an initial deposition rate of the subsequent electroplating process.

In the printed wire board industry, an electroless copper deposition is frequently used for forming copper layers on generally non-conductive patterned structures. The electroless deposition requires an active initiation of a chemical reaction of the agents contained in the plating solution to reduce copper and deposit a copper layer on the structure. The initiation may be accomplished by a catalytic material or, as presently used in printed wire boards, by plating solutions including colloids. Although plating solutions containing colloids may successfully be applied for coating print boards with visa of several tens $\mu$m, this deposition method is quite inappropriate for metallization layers of sophisticated integrated circuits for the following reasons. The colloidal plating solutions may readily develop clusters having a size that may considerably exceed the size of the circuit features of interest. Moreover, the adhesion properties of the plated copper do not conform with the requirements of the semiconductor industry, since usually the excess copper is removed by chemical mechanical polishing demanding a high mechanical stability and thus adhesion of the copper to the adjacent material(s). Consequently, the formation of clusters, even if the size thereof may be maintained below a critical level, in combination with a reduced adhesion, may entail an increased electromigration effect of the copper lines and visa, thereby rendering a corresponding approach less than desirable.

In view of the above-explained situation, it is therefore desirable to provide a technique enabling the efficient formation of a metal layer, such as a copper and/or a copper alloy layer, by electroless deposition, thereby avoiding or at least reducing one or more of the above-identified problems.

SUMMARY OF THE INVENTION

Generally, the present invention is directed to an improved technique for forming a metal layer over a patterned structure by electroless plating deposition, wherein a catalytic material, that is, a material activating a chemical reaction for reducing in the plating solution the metal to be deposited, is provided at least on surface portions of the patterned structure by CVD and/or PVD and/or atomic layer deposition (ALD). The chemically deposited metal layer may then act as a seed layer for an electroplating process to fill in the bulk metal into trenches and visa of the patterned structure.

In accordance with one illustrative embodiment of the present invention, a method of forming a metal layer over a patterned dielectric comprises depositing a first material layer over the patterned dielectric in a gaseous deposition atmosphere including, at least temporarily, a catalytic material. The first material layer is exposed to a plating solution including ions of the metal to be deposited, wherein the catalytic material incorporated in the first material layer initiates a reaction to reduce metal ions and form a metal layer on the first material layer.

According to another embodiment of the present invention, a method of forming a metallization layer comprises depositing a catalytic material over surface portions of a patterned structure by at least one of chemical vapor deposition, physical vapor deposition and atomic layer deposition. Furthermore, a metal layer is formed above the patterned structure by electroless plating deposition with a plating solution, wherein the catalytic material initiates a reaction between agents of the plating solution.

According to yet another illustrative embodiment of the present invention, a metallization structure in an integrated circuit comprises a dielectric layer having formed therein an opening and a metal filled in the opening. Moreover, at least an interface between the metal and the dielectric layer comprises at least one of platinum, palladium, silver, copper and cobalt.

According to a further illustrative embodiment of the present invention, a metallization structure in an integrated circuit comprises a dielectric layer having formed therein an opening and a metal filled in the opening. Furthermore, a barrier layer is formed between the metal and the dielectric layer, wherein at least an interface between the metal and the barrier layer comprises at least one of platinum, palladium, silver, copper and cobalt.

BRIEF DESCRIPTION OF THE DRAWINGS

The invention may be understood by reference to the following description taken in conjunction with the accompanying drawings, in which like reference numerals identify like elements, and in which.

Figure 1A:
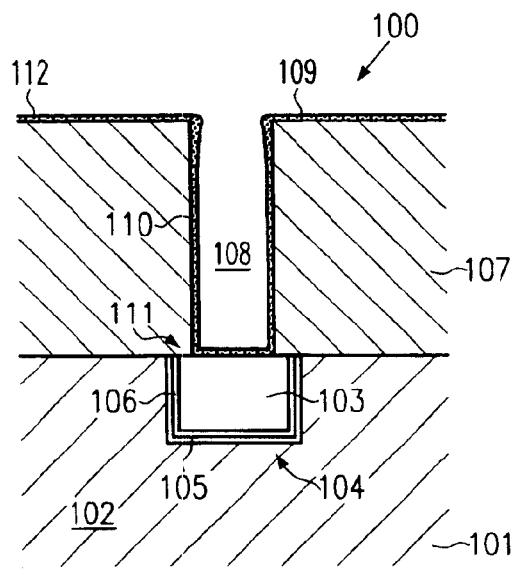
FIGS. 1a–1c schematically show cross-sectional views of a copper-containing metallization structure during various manufacturing stages according to illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the concept that a catalytic material may be incorporated in a dielectric layer or a barrier layer formed on a dielectric by using advanced deposition techniques such as CVD, PVD and ALD, wherein, however, the deposition of the catalytic material does not necessarily need to meet stringent requirements in terms of coverage and uniformity, as already minute amounts of the catalytic material on the surface being in contact with the plating bath suffice to start the reducing reaction and to deposit metal. In this way, a highly conformal metal layer may be produced, thereby avoiding the disadvantages of the previously described electroless plating process using a colloidal plating solution, wherein the metal layer may then be used as a seed layer for a subsequent electroplating process for the deposition of the bulk metal. Due to the excellent conformity and uniformity of the electroless deposited seed layer, the following electroplating process may be performed with superior uniformity compared to a process based on a PVD deposited seed layer. Moreover, as compared to highly complex advanced CVD and ALD techniques, the seed layer according to the present invention is formed at an increased deposition rate and thus reduces the total process time of forming a metallization layer, while the highly conformal electroless deposition enables the scaling of device dimensions to 0.1 $\mu$m and less.

It should further be noted that, in the following illustrative embodiments, it is referred to a metallization layer including copper and an appropriate dielectric material, such as silicon dioxide or, for advanced semiconductor devices, a low-k dielectric material, since in particular the combination of copper and a low-k dielectric seems to represent the most promising regime for the further development of integrated circuits. Nevertheless, the principles of the present invention may not be restricted to devices having visa of a diameter of approximately 0.1 $\mu$m and less, but may be applied to any semiconductor devices when the plating deposition of a metal layer is a promising alternative for the "dry" deposition accomplished by CVD, PVD or ALD. Moreover, the present invention may also be applied in combination with metals other than copper, such as copper alloys, tin, lead, and the like. Thus, the present invention should not be considered as limited to any particular embodiment disclosed herein unless such limitations are expressly set forth in the appended claims.

With reference to FIGS. 1a–1c, 2 and 3, further illustrative embodiments of the present invention will now be described in more detail. In FIG. 1a, a metallization structure 100 comprises a substrate 101 having formed thereon a first dielectric layer 102 containing a metal line 104 comprised of a metal region 103, including, for instance, copper, a first barrier layer 105 and a second barrier layer 106. The metal line 104 is illustrative only in that it represents a typical structure in a damascene scheme. The metal line 104 may, however, represent any circuit element that requires the formation of a via or trench connecting thereto. A second dielectric layer 107, for example comprising silicon dioxide or a low-k material, is formed above the first dielectric layer 102, wherein a via 108 connecting to the metal region 103 is formed in the second dielectric layer 107. A barrier layer 109 is formed on the dielectric layer 107 and on inner surface areas 110 of the via 108. The barrier layer 109 may comprise one or more sub-layers to provide the required barrier and adhesion characteristics. For example, the barrier layer 109 may comprise a tantalum layer and/or a tantalum nitride layer with a thickness that reliably completely covers the surface areas 110, especially at bottom corners 111 of the via 108.

The barrier layer 109 comprises, at least at surface portions facing away from the surface areas 110, a catalytic material 112, wherein the catalytic material is selected so as to be able to initiate a chemical reaction between a metal salt and a reducing agent contained in a plating solution for the deposition of a subsequent metal layer, as will be explained below. In case copper or a copper alloy is to be deposited by electroless plating, the catalytic material may comprise platinum and/or palladium and/or copper and/or silver and/or cobalt, and the like. In some embodiments, the catalytic material 112 may be provided as a substantially continuous layer on the barrier layer 109, whereas, in other embodiments, minute amounts of the catalytic material 112 are incorporated into the barrier layer 109 so that at least a surface of the barrier layer 109 contains the catalytic material 112 in a stoichiometric ratio of approximately 0.01 or more in relation to the barrier material.

In a further illustrative embodiment, the barrier layer 109 may represent a dielectric layer or the surface layer of the second dielectric layer 107, when the metal to be deposited in the via 108 adheres sufficiently to the dielectric layer 107 and does not substantially diffuse at elevated temperatures. For example, silicon nitride offers excellent barrier properties with respect to copper diffusion and may be used as dielectric diffusion barrier when the parasitic capacitance caused by the relatively high k of silicon nitride is not an issue.

A typical process flow for forming the metallization structure 100 may include the following processes. After manufacturing the metal line 104 in the first dielectric layer 102, the second dielectric layer 107 is deposited by, for example, CVD, wherein an additional etch stop layer (not shown) may be deposited prior to the formation of the dielectric layer 107. Subsequently, the via 108 is formed by appropriate photolithography and anisotropic etch techniques. Thereafter, the barrier layer 109 is formed by an appropriate deposition technique as will be described in more detail with reference to FIGS. 2 and 3.

Figure 2:
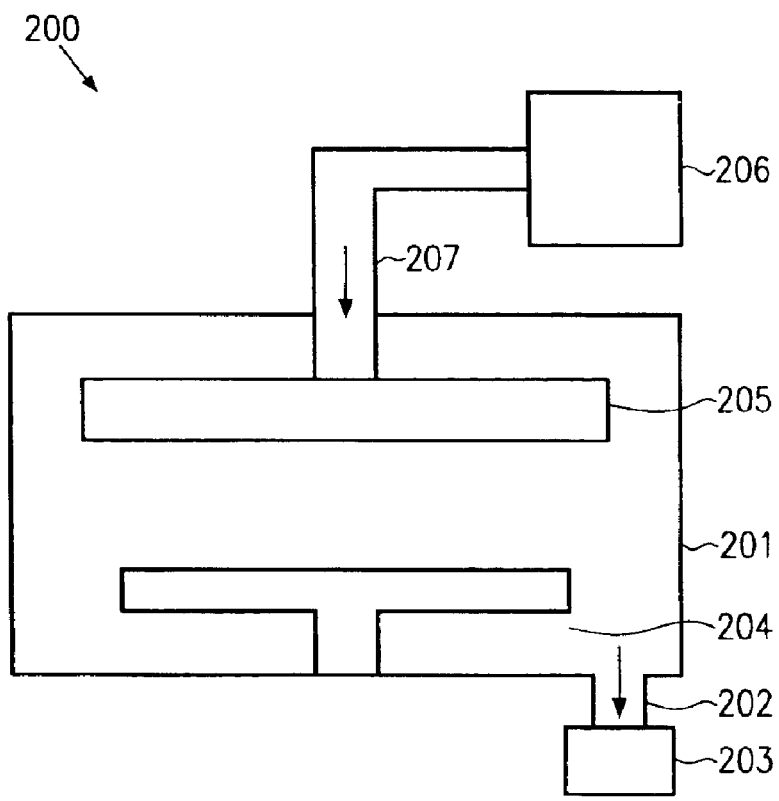
FIG. 2 schematically illustrates a deposition tool for CVD or ALD as may be employed for forming the metallization structure as shown in FIGS. 1a–1c.

FIG. 2 schematically depicts a deposition tool 200 that is configured to deposit a material layer by chemical vapor deposition. The tool 200 comprises a process chamber 201 with an outlet 202 connected to a pump source 203 adapted to actively maintain a desired pressure within the process chamber 201. A substrate hALDer 204 is arranged below a shower head 205, which in turn is connected to a source of precursor and carrier gases 206 via an inlet 207. The substrate hALDer 204 and the process chamber 201 are configured to establish, respectively, a desired temperature on a substrate to be processed and within the chamber 201 so as obtain required deposition conditions on the substrate and an appropriate deposition atmosphere within the chamber 201. For convenience, corresponding means such as radiators and/or heaters are not shown. Moreover, the shower head 205 may include plasma excitation means (not shown) to create a plasma ambient as required for a plasma enhanced CVD process.

In operation, a substrate, such as the substrate 101 having formed thereon the patterned dielectric layer 107, is mounted on the substrate holder 204 and the pump source 203 is operated to establish a pressure required for maintaining a specified precursor in its vaporized state. For example, the barrier layer 109 may be formed as a titanium nitride layer and may therefore be deposited from metallorganic precursors. In other embodiments, the barrier layer 109 may be substantially comprised of tantalum nitride, and suitable tantalum nitride precursors may be supplied by the source 206. Since the deposition rates for a given set of parameters may be determined in advance, the process of depositing the primary barrier material for the barrier layer 109 may be performed until a desired thickness of the barrier layer 109 especially in the bottom corners 111 is achieved. Then, a precursor including the catalytic material 112 is added to the deposition atmosphere so as to continue the deposition of the barrier layer 109, while at a surface portion thereof the catalytic material is incorporated. Suitable candidates for catalyst containing precursors are complexes in the form $Pt(hfac)_2$ (hexafluoroacetylacetonate platinum), or similar compounds in which platinum is replaced by palladium. As previously noted, only small amounts of the catalyst containing precursor may be mixed with the barrier material containing precursor as already traces of the catalyst 112 may sufficiently activate the surface of the barrier layer 109 in a subsequent electrochemical process. In other embodiments, the barrier layer 109 is deposited with the required thickness and thereafter the catalytic material 112 is deposited in a deposition atmosphere tailored for the catalytic containing precursor used. Since a continuous layer of catalytic material 112 on the barrier layer 109 may not be required, the deposition of the catalytic material 112 may in one embodiment be performed immediately after discontinuing the deposition of the barrier layer 109 without elaborate purging of the process chamber 201 or even employing another deposition tool. The appropriate pressure and/or temperature conditions may be established during the supply of the catalyst containing precursor or may be adjusted after the barrier deposition and prior to the supply of the catalyst containing precursor. Due to the minute amount of catalyst 112 required, the deposition time, therefore, may be in the range of approximately 1–10 seconds. For example, a surface coverage of the catalyst material 112 with respect to the underlying material, such as the barrier layer 109, of approximately 5–15%, and in some embodiments of approximately 10%, may suffice to provide the required activating characteristics in a subsequent plating process. The amount of catalyst containing precursor is selected to obtain the desired degree of surface coverage.

In other embodiments, the catalytic material 112 may be provided as a substantially continuous layer and may thus form a surface portion of the barrier layer 109. This embodiment may be advantageous when the catalytic material shows superior adhesion and/or barrier characteristics with respect to the metal to be formed on the barrier layer 109.

In other embodiments, the constraints in view of conformity of the layer deposition without generating particles and the electrical resistivity thereof may not efficiently be met for various topographies of the metallization structure 100 and for certain barrier materials, such as tantalum nitride, often used as barrier layers in copper metal lines. In these cases, the atomic layer deposition (ALD) technique may represent a superior candidate due to its ability of growing thin films having an excellent conformity even in high aspect ratio visa without generating substantially any particles, which is otherwise caused by intermixing of reactant gases used in CVD. Moreover, ALD and plasma enhanced ALD allow the control of the layer thickness on an atomic scale due the digital nature of the process, wherein each deposition cycle requires the sequential provision of at least two reactants which then react on the surface of the substrate to deposit the desired barrier material, such as tantalum nitride. For the ALD process or the plasma enhanced ALD process, in principle, a deposition tool similar to that described with reference to FIG. 2 may be used, and hence in the following description it is referred to as the deposition tool 200.

During a first cycle, a tantalum nitride precursor, such as TBTDET ($(Net_2)_3Ta$), is supplied at an appropriate pressure to the substrate 101 by means of a carrier gas, such as argon. Thereafter, a purge step may be performed, followed by the supply of a reducing gas, or, as in the plasma enhanced ALD process, reducing radicals may be generated by the plasma. For example, a hydrogen or an ammonia plasma may be established to form a layer of tantalum or tantalum nitride on the metallization structure 100. Thereafter, a further purge step may be performed, and the above sequence may be repeated until the desired thickness is obtained. Next, a catalyst containing precursor, such as Pt(hfac) or Pd(hfac), may be introduced into the process chamber once an appropriate deposition temperature and pressure are established. A layer of the catalytic material 112, which may or may not be continuous (depending on the duration of the catalyst deposition) is then formed on the barrier layer 109.

In other embodiments, catalyst atoms, such as platinum or palladium atoms created by the plasma, may be incorporated into the barrier layer 109 so as to form an activating surface for the subsequent electrochemical deposition of copper. In a further embodiment, one or more of the final deposition cycles may be performed in the presence of minute amounts of the catalyst containing precursor resulting in a surface coverage as specified above to thereby incorporate traces of the catalyst 112 into the layer 109 without significantly affecting the deposition kinetics and thus the barrier characteristics of the layer 109. For example, the minute amount of catalyst containing precursor may be added during the supply of the barrier precursor and/or during the supply of the reducing agent and/or during the purging steps intermittently performed. Consequently, except for the additional supply of a small amount of catalyst containing precursor gas, the process for the deposition of the barrier layer 109 may be performed with process parameters selected to obtain superior process performance and/or enhanced characteristics of the barrier layer 109. Deposition times for incorporating the catalyst may range from approximately 10–30 seconds.

Figure 3:
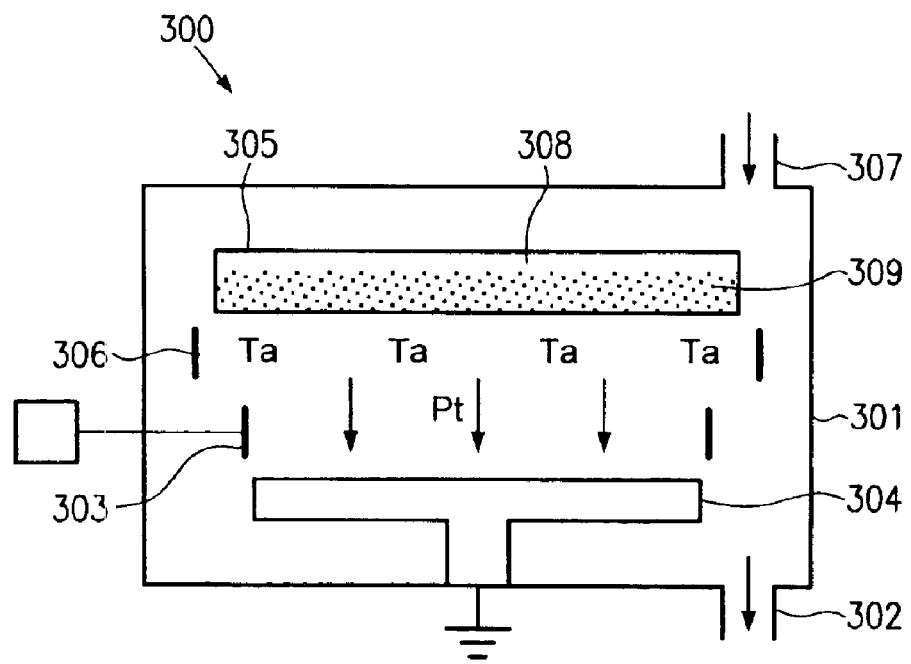
FIG. 3 schematically depicts a PVD tool suitably equipped to form a catalytic material layer for the formation of the metallization structure shown in FIGS. 1a–1c.

With reference to FIG. 3, further embodiments will be described, wherein the barrier layer 109 and the catalytic material are formed by physical vapor deposition (PVD), such as sputter deposition. In FIG. 3, a sputter deposition tool 300 comprises a process chamber 301 including an outlet 302, connected to an appropriate pump source (not shown), and an inlet 307, connected to a source of precursor gases and carrier gases (not shown). A substrate hALDer 304 is arranged downstream of an ionizing means 303, which is configured to ionize atoms and direct them onto a substrate mounted on the substrate hALDer 304 that is electrically connected to ground potential. A plasma excitation means 306 is located in the vicinity of a sputter target 305, which in one embodiment is comprised of a component 308 of the barrier material, such as tantalum, wherein distributed therein is a catalytic material 309, such as platinum, palladium, and the like. The ratio between the barrier material 308 and the catalyst 309 may range from approximately 100:5. The catalyst 309 may be substantially uniformly distributed, at least at a surface portion of the target 305, wherein the term "uniform distribution" relates to a global scale of the target 305 and describes a substantially uniform release of catalyst atoms, that is a substantially constant number of catalyst atoms sputtered off the target 305 for a given set operating conditions of the sputter tool 300. Therefore, the catalyst material 309 may be provided continuously or in discrete amounts as long as the sputter rate is substantially constant for given tool operating conditions, wherein the fraction of catalyst atoms in the deposition ambient for given tool operating conditions is then determined by the ratio of barrier material 308 and catalyst material 309 in the target 305.

In other embodiments, the target 305 may be formed of one or more portions comprised of the barrier material 308 and one or more portions comprised of the catalyst material 309, wherein the ratio of the surface area of the one or more barrier material portions 308 and of the one or more catalyst portions 309 substantially determines the ratio of sputter atoms released by bombarding the target 305. In one embodiment, the catalyst material 309 may be arranged at the perimeter of the substantially disc-shaped target 305 and the plasma excitation means 306 possibly in combination with a magnet assembly (not shown) may be operated so as to adjust the amount of particles hitting the perimeter of the target 305, thereby controlling the amount of released catalyst material 309. In another embodiment, the target 305 may comprise a controllable shield (not shown) to cover one or more portions of the catalytic material 309 to adjust the amount of released catalytic atoms.

It should be appreciated that the deposition tool 300 is of illustrative nature only and therefore any other appropriate sputter tool may be employed. For instance, some conventional tools may be equipped with a hollow cathode configuration, wherein the cathode, that is, the target, is formed to obtain a high degree of collimating of atoms and ions approaching the substrate hALDer 304. In other tools, any type of collimator may be arranged between the target 305 and the substrate hALDer 304 to achieve a substantially perpendicular impact of the target ions onto the substrate as required for a circuit topography with high aspect ratio visa and trenches. In these tools, the catalytic material 309 may additionally or instead be provided on the collimator, thereby simplifying the configuration of the target 305 as less or even none of the catalytic material 309 may be necessary in the target 305. In other sputter tools, the barrier material 308 and the catalytic material 309 may be coated on corresponding coils for generating a plasma. Regarding the arrangement of the catalytic material 309, the same criteria apply as given above with reference to the target 305 as shown in FIG. 3.

During operation, the process parameters, such as power supplied to the plasma excitation means 306, power supplied to the ionizing means 303, pressure in the chamber 301, and the like, are adjusted to obtain a target ion and/or atom bombardment having the required directionality. Due to the arrangement of the catalytic material 309 according to one or more of the above-described embodiments, a specified percentage of this catalytic material is also present in the atmosphere surrounding the substrate hALDer 304 and, hence, a substrate, such as the substrate 101, placed thereon. Therefore, the catalytic material 309 is also deposited and thus incorporated into the barrier layer 109, thereby forming the portion 112, which may in some embodiments be substantially uniformly distributed throughout the entire thickness of the barrier layer 109.

In other embodiments, the release of catalytic material 309 may be controlled by, for example, temporarily shielding one or more catalyst containing portions of the target 305, as described above. Consequently, the deposition of the catalytic material 309 may be advantageously deposited during the final phase of the deposition process so that the catalytic material 112 in the barrier layer 109 is formed substantially at the surface region thereof, thereby providing the required catalyst properties without unduly affecting the overall characteristics of the barrier layer 109.

In a further embodiment, the barrier layer 109 may be deposited in the presence of a suitable precursor gas, for example containing nitrogen, in order to form a nitride layer or nitride sub-layer in the barrier layer 109. Similarly, an appropriate precursor gas containing the catalyst material 309, such as platinum in a porous-like state of increased surface area, palladium, silver, copper, cobalt may be added, either permanently or during the final phase, to incorporate the catalyst 309 and form the portion 112 in the barrier layer 109. The amount of catalyst 309 incorporated into the barrier layer 109 may be controlled by the amount, i.e., the flow rate, of catalyst containing precursor added to the deposition atmosphere in the chamber 301 and/or the duration of feeding the catalyst containing precursor. In one embodiment, platinum or palladium containing hfac complexes may be added at a flow rate of approximately 10–100 sccm for a time interval in the range of approximately 2–10 seconds for a CVD-like process, and approximately 10–30 seconds for an ALD-like process in depositing the catalyst 309, wherein a pressure in the chamber 301 is maintained well below the vapor pressure of the catalyst containing precursor of approximately 0.15 Torr. In one embodiment, the deposition of the barrier layer 109 is performed with well-established process parameters until a desired composition and thickness is obtained so that required characteristics and a quality of the barrier layer 109 is ensured. Thereafter, the catalyst containing precursor is added to form the portion 112 substantially at the surface of the barrier layer 109, thereby preserving the barrier characteristics of the layer 109.

It should be noted that the present invention should not be restricted to tantalum, titanium, tantalum nitride or titanium nitride layers as the barrier layer 109, but may be applied with any suitable layer or layer stack required in current and future metallization structures. Suitable sputter targets including a catalyst and/or catalyst containing precursors may then be employed in accordance with the deposition process under consideration. In some cases, it may be convenient or necessary to divide the deposition of the barrier layer 109 in two or more deposition steps, depending on the complexity of the barrier layer stack, so that only the last deposition step needs to be adapted to adding catalytic material to the barrier layer 109. In other embodiments, it may be considered appropriate to perform the deposition of the catalytic material as the last step of a corresponding formation sequence including one or more steps for forming the barrier layer 109 including the catalytic material 112 substantially in the surface region. In one particular embodiment, this final step for depositing the catalytic material to form the catalytic portion 112 is carried out in the same process chamber as the preceding step for forming the barrier layer 109 or a portion thereof without breaking the vacuum. For instance, when the deposition chamber includes plasma excitation means, as is usually the case for sputter deposition, plasma enhanced CVD and plasma enhanced ALD, a catalyst containing plasma ambient may be established and the barrier layer 109 may be "doped" by the catalyst, wherein, for example, an amount and/or a penetration depth of the catalyst ions may be controlled by the plasma characteristics and a bias voltage applied between the plasma and the substrate. In this way, a desired amount of catalyst may be incorporated into the barrier layer 109 at a controllable depth, which may be advantageous for highly sophisticated metallization structures having a barrier layer thickness of 10 nm or even less. By controlling the amount and/or the depth of the incorporated catalyst, the barrier and adhesion properties of the layer 109 may not be substantially negatively affected.

Depending on the process sequence for forming the barrier layer 109, in some embodiments, it may be appropriate to combine two or more of the above-described deposition techniques, that is, CVD, ALD and PVD, wherein, in one or more of these techniques, the catalytic portion 112 may be formed in a manner as described above.

Figure 1B:
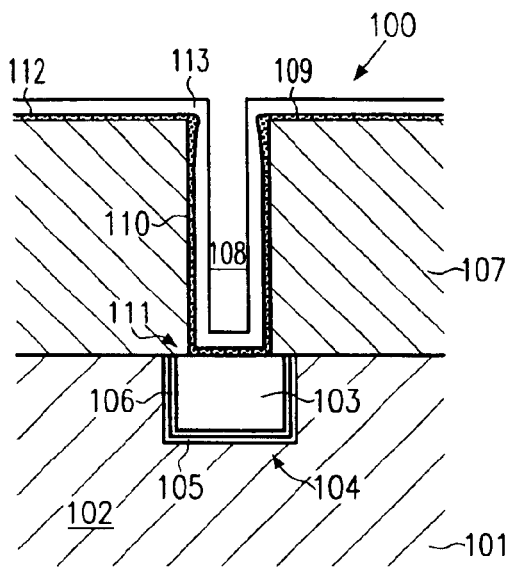

Referring to FIG. 1b, the metallization structure 100 comprises a metal layer 113, such as a copper layer, which, in one particular embodiment, acts as a seed layer for a subsequent deposition process. The metal layer 113 is formed by electroless deposition by exposing the metallization structure 100 to an electrolyte bath (not shown) containing a salt of the metal to be deposited and a reducing agent. For example, for a copper layer, any of the presently available and approved bath compositions, such as copper, EDTA NaOH and HCHO, or copper, KNa tartrate, NaOH, HCHO may be used. Due to the catalytic portion 112 in the barrier layer 109, the deposition reaction starts automatically and leads to a highly uniform metal deposition with superior crystallinity. The thickness of the metal layer 113 may readily be controlled by adjusting the time interval for exposing the metallization structure 100 to the electrolyte bath. Compared to conventional deposition methods for forming, for example, a copper seed layer in high aspect ratio visa, such as sputter deposition or CVD, significantly higher deposition rates are obtained by the electroless plating, while still providing a degree of conformity that is as high as is hardly practical with sputter deposition.

In order to optimize the formation process of the metal layer 113, a plurality of test runs may be carried out to determine an appropriate amount and type of catalyst material 112 in the barrier layer 109 that results in a rapid reaction with the desired degree of conformity and quality of the metal layer 113. For instance, a ratio of platinum and barrier material in the layer 109 as is specified with reference to FIG. 1a enables the formation of a copper layer having a thickness in the range of approximately 2–50 nm in a time interval of approximately 5–20 seconds within visa of 0.1 $\mu$m diameter and less with a depth of 1 $\mu$m and even more.

Figure 1C:
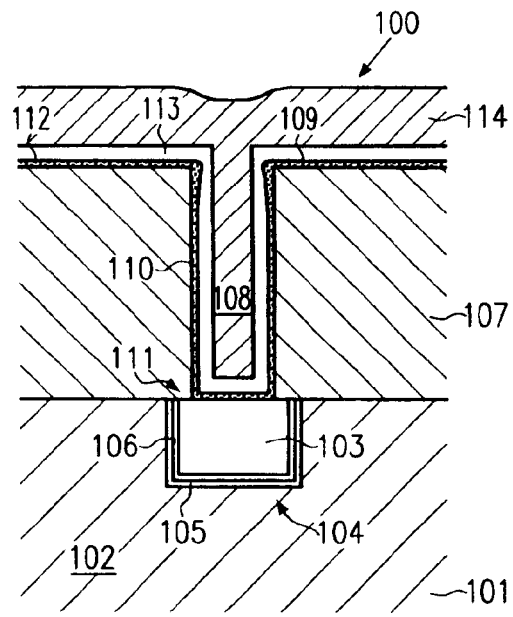

FIG. 1c schematically shows the metallization structure 100 after filling the via 108 by electroplating with a metal, thereby forming a layer 114 of excess metal on top of the structure 100. The metal fill process may be accomplished by well-established "bottom-up" electroplating deposition techniques, in which the metallization structure 100 is inserted in an electroplating bath (not shown) that may contain suitable additives ensuring the highly non-conformal deposition of the metal substantially without voids and seams in the via 108. Thereby, the metal layer 113 acting as a seed layer may even enhance the fill capability of the electroplating process due to the substantially uniform thickness and thus current distribution provided by the layer 113. The excess metal layer 114 may then be removed by any suitable process, such as CMP, wherein the mechanical stability of the metal filled in the via 108 may exhibit essentially the same quality as in a conventional metallization sequence without an electrochemical formation of a seed layer, or may even show superior stability due to the improved characteristics of the metal layer 113 compared to a seed layer formed by sputter deposition in a high aspect ratio via. As previously pointed out, the formation of the catalytic layer portion 112 in the barrier layer 109 may be adjusted so as to substantially not impair the adhesion properties of the barrier layer 109 during the CMP process and any subsequent process steps.

Although the above illustrative embodiments refer to the formation of a metallization structure by an electroplating process using the metal layer 113 as a seed layer, which is especially advantageous for advanced microstructures having features with dimensions in the deep sub-micron regime due to the well-established "bottom-up" technique in the electroplating process, it should be appreciated that the metal layer 114 may also be formed by electroless deposition, wherein the layer 113 may be formed during a first deposition step or as a first period of a single deposition step for filling the via 108, especially when the topography of the metallization structure 100 is less critical.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a metal layer over a patterned dielectric formed on a substrate, the method comprising:

depositing a first material layer over said patterned dielectric in a gaseous deposition atmosphere including, at least temporarily, a catalytic material, wherein depositing said first material layer comprises establishing said gaseous deposition atmosphere by supplying one or more precursor gases, whereby at least one of said precursor gases includes said catalytic material;

exposing said first material layer to a plating solution including ions of the metal to be deposited, wherein said catalytic material incorporated in said first material layer initiates a reaction to reduce metal ions and to form a metal layer on said first material layer; and controlling an amount of catalytic material incorporated into said first material layer by controlling at least one of a flow rate and a duration of supply of said catalytic material containing precursor gas.

2. The method of claim 1, wherein said catalytic material comprises at least one of platinum, palladium, silver, copper and cobalt.

3. The method of claim 1, wherein depositing said first material layer comprises establishing said gaseous deposition atmosphere by sputtering atoms of said first material off a target and supplying a precursor containing said catalytic material.

4. The method of claim 1, further comprising adjusting a ratio of atoms of said first material and of said catalytic material in said gaseous deposition atmosphere.

5. The method of claim 1, wherein said catalytic material containing precursor gas is supplied after a predefined thickness of said first material layer is deposited.

6. The method of claim 1 or 3, wherein said catalytic material containing precursor gas is supplied after the deposition of said first material layer is discontinued.

7. The method of claim 1, wherein at least two different precursor gases are supplied sequentially to deposit said first material layer in a digitally controlled manner.

8. The method of claim 1, wherein said first material layer comprises a barrier layer substantially preventing diffusion of said metal into substrate portions covered by said barrier layer.

9. The method of claim 1, further including forming a second metal layer over said metal layer by electroplating, wherein said metal layer acts as a seed layer.

10. The method of claim 1, wherein said metal layer comprises copper.

11. The method of claim 1, wherein depositing said first material layer comprises establishing said gaseous deposition atmosphere by sputtering atoms of said first material and, at east temporarily, catalyst atoms off a target.

12. The method of claim 11, wherein said catalytic material is substantially uniformly distributed in said target.

13. The method of claim 11, wherein said catalytic material is provided on one or more distinct portions of said target.

14. A method of forming a metallization layer, comprising:

depositing a catalytic material over surface portions of a patterned structure by at least one of chemical vapor deposition, physical vapor deposition, atomic layer deposition and plasma treatment;

forming a metal layer above said patterned structure by electroless plating deposition using a plating solution, wherein said catalytic material initiates a reaction between agents of said plating solution; and depositing a barrier layer on said patterned structure, wherein said barrier layer is deposited by the same deposition technique as said catalytic material and wherein said barrier layer is deposited by sputter deposition, whereby at least a portion of a sputter target comprises said catalytic material, and wherein said catalytic material is deposited after the deposition of said barrier layer without breaking the vacuum established during the deposition of said barrier layer.

15. The method of claim 14, wherein said barrier layer is deposited by chemical vapor deposition, whereby at least at the end of the deposition of said barrier layer a precursor containing said catalytic material is present.

16. The method of claim 14, wherein a ratio of barrier material atoms and catalytic material atoms in a sputter deposition ambient is adjusted by selecting at least one of controlling a density of said catalytic material in said target and controlling an exposed surface area of a target portion comprised of catalytic material.

17. The method of claim 14, wherein said barrier layer is deposited by sputter deposition, whereby a precursor gas containing said catalytic material is supplied during the deposition of said barrier layer.

18. A method of forming a metal layer over a patterned dielectric formed on a substrate, the method comprising:

depositing a first material layer over said patterned dielectric in a gaseous deposition atmosphere including, at least temporarily, a catalytic material, wherein depositing said first material layer comprises establishing said gaseous deposition atmosphere by sputtering atoms of said first material off a target and supplying a precursor containing said catalytic material; and exposing said first material layer to a plating solution including ions of the metal to be deposited, wherein said catalytic material incorporated in said first material layer initiates a reaction to reduce metal ions and to form a metal layer on said first material layer.

19. A method of forming a metal layer over a patterned dielectric formed on a substrate, the method comprising:

depositing a first material layer over said patterned dielectric in a gaseous deposition atmosphere including, at least temporarily, a catalytic material, wherein depositing said first material layer comprises establishing said gaseous deposition atmosphere by supplying one or more precursor gases, whereby at least one of said precursor gases includes said catalytic material;

exposing said first material layer to a plating solution including ions of the metal to be deposited, wherein said catalytic material incorporated in said first material layer initiates a reaction to reduce metal ions and to form a metal layer on said first material layer; and adjusting a ratio of atoms of said first material and of said catalytic material in said gaseous deposition atmosphere.

20. A method of forming a metallization layer, comprising:

depositing a catalytic material over surface portions of a patterned structure by at least one of chemical vapor deposition, physical vapor deposition, atomic layer deposition and plasma treatment;

forming a metal layer above said patterned structure by electroless plating deposition using a plating solution, wherein said catalytic material initiates a reaction between agents of said plating solution; and depositing a barrier layer on said patterned structure, wherein said barrier layer is deposited by the same deposition technique as said catalytic material and wherein said barrier layer is deposited by sputter deposition, whereby a precursor gas containing said catalytic material is supplied during the deposition of said barrier layer.

21. A method of forming a metallization layer, comprising:

depositing a catalytic material over surface portions of a patterned structure by at least one of chemical vapor deposition, physical vapor deposition, atomic layer deposition and plasma treatment;

forming a metal layer above said patterned structure by electroless plating deposition using a plating solution, wherein said catalytic material initiates a reaction between agents of said plating solution; and depositing a barrier layer on said patterned structure, wherein said barrier layer is deposited by the same deposition technique as said catalytic material and wherein said barrier layer is deposited by atomic layer deposition, whereby at least at the end of the deposition of said barrier layer a precursor containing said catalytic material is present.

22. A method of forming a metallization layer, comprising:

depositing a catalytic material over surface portions of a patterned structure by at least one of chemical vapor deposition, physical vapor deposition, atomic layer deposition and plasma treatment;

forming a metal layer above said patterned structure by electroless plating deposition using a plating solution, wherein said catalytic material initiates a reaction between agents of said plating solution; and depositing a barrier layer on said patterned structure, wherein said catalytic material is deposited after the deposition of said barrier layer without breaking the vacuum established during the deposition of said barrier layer.

23. The method of claim 22, wherein said barrier layer is deposited by the same deposition technique as said catalytic material.

24. The method of claim 22, wherein said barrier layer is deposited by sputter deposition, whereby a precursor gas containing said catalytic material is supplied during the deposition of said barrier layer.

25. The method of claim 22, wherein said barrier layer is deposited by atomic layer deposition, whereby at least at the end of the deposition of said barrier layer a precursor containing said catalytic material is present.

26. The method of claim 22, wherein said barrier layer is deposited by sputter deposition, whereby at least a portion of a sputter target comprises said catalytic material.

27. The method of claim 26, wherein a ratio of barrier material atoms and catalytic material atoms in a sputter deposition ambient is adjusted by selecting at least one of controlling a density of said catalytic material in said target and controlling an exposed surface area of a target portion comprised of catalytic material.

28. A method of forming a metal layer over a patterned dielectric formed on a substrate, the method comprising:

depositing a first material layer over said patterned dielectric in a gaseous deposition atmosphere including, at least temporarily, a catalytic material, wherein depositing said first material layer comprises establishing said gaseous deposition atmosphere by sputtering atoms of said first material off a target and supplying a precursor containing said catalytic material;

exposing said first material layer to a plating solution including ions of the metal to be deposited, wherein said catalytic material incorporated in said first material layer initiates a reaction to reduce metal ions and to form a metal layer on said first material layer; and adjusting a ratio of atoms of said first material and of said catalytic material in said gaseous deposition atmosphere.

* * * * *